United States Patent [19]
Allingham

[11] Patent Number: 5,937,182
[45] Date of Patent: Aug. 10, 1999

[54] DESIGN VERIFICATION SYSTEM USING EXPECT BUFFERS

[75] Inventor: Donald N. Allingham, Fort Collins, Colo.

[73] Assignee: Adaptec, Inc., Milpitas, Calif.

[21] Appl. No.: 08/829,316

[22] Filed: Mar. 27, 1997

[51] Int. Cl.[6] .................................................. G06F 9/455
[52] U.S. Cl. ................................ 395/500.03; 395/500.34
[58] Field of Search ............................. 395/500; 364/578

[56] References Cited

U.S. PATENT DOCUMENTS

| | | | |
|---|---|---|---|
| 4,807,182 | 2/1989 | Queen ...................................... | 707/511 |
| 5,101,424 | 3/1992 | Clayton et al. ........................... | 397/10 |
| 5,327,361 | 7/1994 | Long et al. ............................... | 364/57 |
| 5,488,648 | 1/1996 | Womble .................................... | 375/13 |
| 5,794,005 | 8/1998 | Steinman ................................... | 395/500 |

OTHER PUBLICATIONS

Wagner & Keane, "A Strategy to Verify Chassis Controller Software–Dynamics, Hardware, and Automation," IEEE Transactions on Systems, Man, and Cybernetics–Part A: Systems and Humans, vol. 27 No. 4, pp. 480–493, Jul. 1997.

*Primary Examiner*—Kevin J. Teska
*Assistant Examiner*—Samuel Broda
*Attorney, Agent, or Firm*—Duft, Graziano & Forest, PC

[57] ABSTRACT

A design verification system for simulating designs and evaluating the simulation results against a set of expected events. A set of expected events are generated and loaded into an expect buffer. As the simulation proceeds, each modelled device collects data on each event into an event record. Each event record is compared against the set of expected events. If the set of expected events contains an entry that matches the event record, the matching entry is removed from the expect buffer. If a matching entry is not found then the event record is flagged as an error. The system is flexible to design changes and efficient as the exact ordering of events is not critical to the simulation outcome.

13 Claims, 4 Drawing Sheets

DESIGN VERIFICATION SYSTEM USING EXPECT BUFFERS

FIELD OF THE INVENTION

The present invention relates to the field of system level simulation of computer hardware systems. More particularly the present invention relates to a system for evaluating the results of a system level hardware simulation. Still more particularly the present invention relates to a system for utilizing an expect buffer the contents of which are compared against simulation events to confirm proper operation and flag incorrect operation.

STATEMENT OF THE PROBLEM

Complex computer hardware systems are typically tested or verified using system level simulation. In a system level simulation, the Device Under Test ("DUT") is surrounded by high level models of the environment in which the DUT will operate. The DUT is any functionality, such as, but not limited to, a hard disk or a bus to bus bridge, whose operation can be defined in terms of its interactions with its environment. In a system level simulation, the DUT's correctness is determined by its interaction with the surrounding models. Well known, commercially available system level simulation tools include Verilog-XL from Cadence Design Systems and SILOS III from Simucad, Inc. The concepts and tools for system level testing are well defined but the present methods for evaluating the results of the testing are inefficient, time consuming and, in some instances, ineffective.

An exemplary application of a system level simulation is the design verification of a bus to bus bridge. The bridge is the DUT and its design is modelled for the simulation. The two busses and other devices attached to the busses are also modelled. The operational correctness of the bus to bus bridge is determined by its interaction with other modelled devices in the environment. A simulation is run by initiating various transactions using the bridge to control communications between devices connected to one of the busses and devices connected to the other bus.

The actual simulation techniques are well known to those skilled in the art of system level simulation. A problem arises, however, in the evaluation of the results from a system level simulation. One evaluation method requires visual inspection of the simulation via waveforms or print-on-change state lists. This approach is slow and prone to errors. Another method involves a cycle for cycle comparison of the current simulation to a previously executed and known simulation. Each and every cycle must run identically to the original simulation or it is flagged as an error. Thus, this method is not tolerant to design changes. For example, the design of the bus to bus bridge noted in the above example may change significantly over the course of its development. While still performing the same operations, the bus to bus bridge may accomplish those operations using events having different timing and ordering. Present methods of evaluating system level simulations are sensitive to these changes in the explicit ordering and timing of events even though their change may not be indicative of error. A further method is to check the final state at the conclusion of the simulation. This approach is incapable of identifying intermediate errors that may be masked by further operation of the simulation.

A design verification system is needed that provides efficient and flexible evaluation of system level simulation results. In particular, there is a need for a design verification system that reports occurrence of expected events and flags event failures and is flexible enough to apply to successive DUT design iterations without requiring re-configuration.

STATEMENT OF THE SOLUTION

The above-described problems and others are solved and an advance in the art is thereby achieved by the expect buffer-based design verification system of the present invention. The system of the present invention compares a present simulation, event by event, to a set of expected events stored in an expect buffer. The design verification system of the present invention allows a user to specify the events that should occur over a period of time. The system is capable of verifying that all the expected events occur and that no unexpected events occurred. The system is tolerant to design changes since the explicit timing and ordering of these events may not be important. Thus the expect buffer-based design verification system of the present invention greatly simplifies the user's process of evaluating system level simulation results.

A user determines which events are expected over a period of time when the DUT is exercised to perform certain operations. The user of the present invention loads this set of expected events into an expect buffer at a test bench. The term "test bench" refers to that part of a system level simulation tool that is not the DUT. The test bench includes the models of devices making up the environment of the DUT as well as various data gathering and analysis tools. One skilled in the art of system level simulations understands the use and configuration of a test bench within a system level simulator. There is no necessary sequential ordering of the events loaded in the expect buffer. The device models and the DUT are configured to collect data for each event occurrence into an event record. The device models report the event record to the main test bench on completion of each event. The test bench searches the expect buffer for an entry matching the just-completed event. A matching event entry is removed from the expect buffer while the lack of a matching event entry triggers the system of the present invention to flag the just-completed event as an unexpected event.

An exemplary application of the design verification system of the present invention is the simulation of a PCI to PCI bridge. The bridge the two bridged-busses and various devices connected to the busses are modeled, as is known by those skilled in the art, utilizing a well-known simulation language or Hardware Definition Language ("HDL") such as Verilog, VHDL or C. An expect buffer is created at the test bench and is loaded with the set of events expected to occur during the time frame of interest for a given simulation. The simulation is then begun. Each time an event occurs, e.g. a device connected to one of the busses writes data to a device connected to the other bus, the relevant modeled device notifies the test bench. The test bench then extracts the event record from the model and then searches the expect buffer to locate a matching entry. If a matching entry is found then it is removed from the expect buffer. If a matching event entry is not found in the expect buffer then an error message is reported. When the simulation is complete or the expect buffer checking is disabled any remaining entries in the expect buffer are reported as missing events.

The system of the present invention is flexible enough to handle design changes without requiring reconfiguration. The explicit timing and ordering of events can change from one simulation to the next but the system only requires that certain events occur, not that they occur in a specific order or at a certain time. On the other hand, the system of the present invention can be configured to check for specific orderings or timings if this is important to determine proper operation of the DUT. One approach is to narrow the time window during which the system of the present invention compares events against the expect buffer. Another approach is to configure the expect buffer to have event sequences which must occur in the simulation in the specified order for them to be considered appropriate.

DETAILED DESCRIPTION

Figure 1:
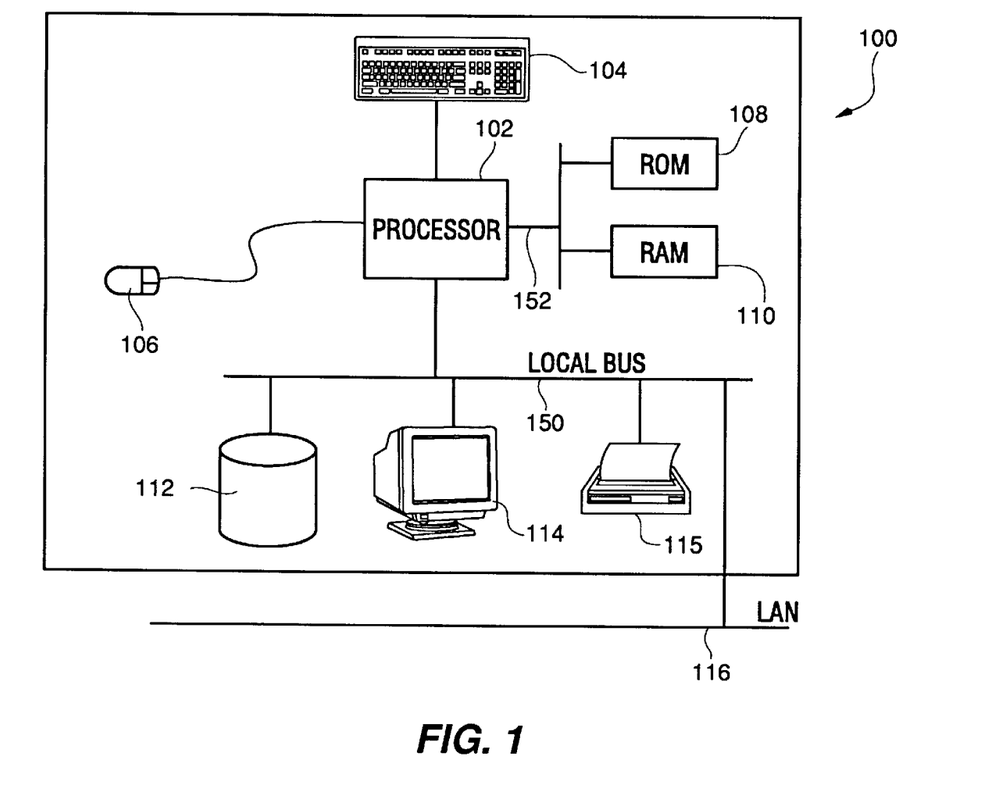
FIG. 1 depicts a block diagram example of a computer system on which is implemented the design verification system of the present invention.

Expect Buffer-Based Design Verification System Computing Environment—FIG. 1

FIG. 1 illustrates a block diagram example of a computer system 100 used to implement an expect buffer-based design verification system. The design verification system of the present invention is operable in any of several standard computing systems readily available in the industry. Programmed instructions for the design verification system are executable on processor 102. Processor 102 stores and-or retrieves the programmed instructions and/or data from memory devices that include, but are not limited to, Random Access Memory (RAM) 110 and Read Only Memory (ROM) 108 by way of memory bus 152. Another accessible memory device includes non-volatile memory device 112 by way of local bus 150. User input to computer system 100 is entered by way of keyboard 104 and/or pointing device 106. Human readable output from computer system 100 is viewed on display 114 or in printed "report" form on local printer 115. Alternatively, computer system 100 is accessible for user input and/or generating human readable displays in printed and/or display screen output form by way of Local Area Network (LAN) 116 in a manner well known in distributed computing and computer network art.

Figure 2:
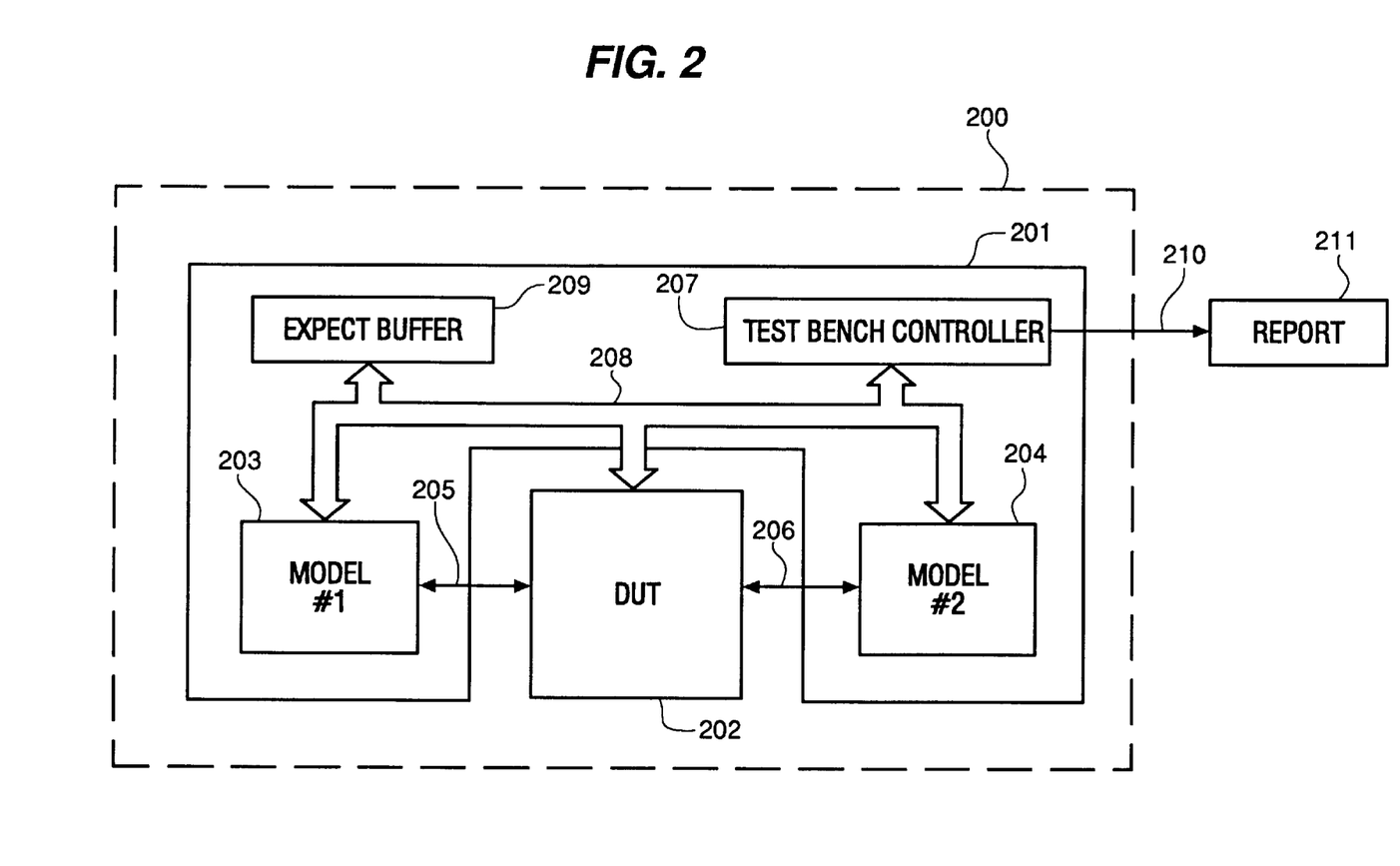
FIG. 2 depicts a block diagram of a simulated system and an expect buffer-based design verification system according to the present invention.

Design Verification System in General—FIG. 2

FIG. 2 depicts a block diagram of the expect buffer-based design verification system 200 of the present invention. System 200 includes test bench 201 and DUT 202. DUT 202 is the simulated design of the hardware design under test. The design of DUT 202 is expressed in Verilog, C or any other simulation language. The operation of a DUT in a system level simulation is determined by the extent to which the DUT interacts properly with its environment. The environment of the DUT is defined by the other devices with which the DUT interacts and the means by which the DUT and other devices interact. In the example of FIG. 2, the environment of DUT 202 includes device models 203–204 and lines 205–206. Lines 205–206 might represent data busses or single conductors. Test bench controller 207 is programmed by a user to control the simulation of DUT 202. Communications between test bench controller 207 and DUT 202 and device models 203–204 occur over bus 208. Bus 208 is a hardware bus or preferably is a set of data structures providing communication between the various models. Communications and data over bus 208 do not disturb the operational characteristics of DUT 202 or its transactions with device models 203–204.

As noted above, devices are modelled within design verification system 200 using a language such as Verilog or any other simulation language. The techniques for simulating designs in such simulation languages are well known to those skilled in the art and do not form part of the present invention. The present invention builds on known modeling techniques with an advantageous simulation evaluation method and apparatus.

Device models 203–204 are capable of collecting data, in the form of an event record, relating to each event that occurs between one of device models 203–204 and DUT 202. Test bench controller 207 can, over bus 208, extract the event record from device models 203–204. The collection of event data by a model and extraction of an event record from a model by the test bench are described in more detail with respect to FIGS. 4–6.

Expect buffer 209 contains a list of expected events input by a user. These expected events are stored in expect buffer 209 using the same semantics as that used by device models 203–204 in collecting simulated event information. The form of the event record is dependent upon the device model and is described in more detail with respect to FIGS. 4–6. The user designs a simulation to be comprised of various operations involving DUT 202. Test bench controller 207 is programmed with the operations comprising a particular simulation of DUT 202. The effect of each programmed operation is characterized by certain events occurring at the modeled devices 203–204 with which DUT 202 interacts. The user compiles a list of expected events and loads this list of expected events into expect buffer 209.

Test bench controller 207 is programmed with a set of operations that together comprise a specific simulation of the operation of DUT 202. Test bench controller 207 directs DUT 202 to perform the programmed operations by manipulating, over bus 208, the inputs to DUT 202, as appropriate. There may, of course, be any number of modelled devices in addition to device models 203–204. With each programmed operation, DUT 202 interacts with its environment, e.g. device models 203–204, in the form of events recorded as event records at device models 203–204. With each event at a model, the model indicates to test bench controller 207 that an event has occurred. Test bench controller 207 then extracts, over bus 208, the relevant event record from the model. Test bench controller 207 operates to compare the event record extracted from the model with the expected events stored in expect buffer 209. In the case where an event record collected by one of device models 203–204 matches an expected event in expect buffer 209, test bench controller 207 operates to remove the matching expected event from expect buffer 209. In the case where an event record does not match an expected event in expect buffer 209, test bench controller 207 flags the event record as an error. When the simulation is complete, test bench controller 207 outputs a report 211 over line 210 listing the event records for which there were no matching expected events in expect buffer 209 and the expected events for which there were no event records collected by modelled devices 203–204.

Figure 3:
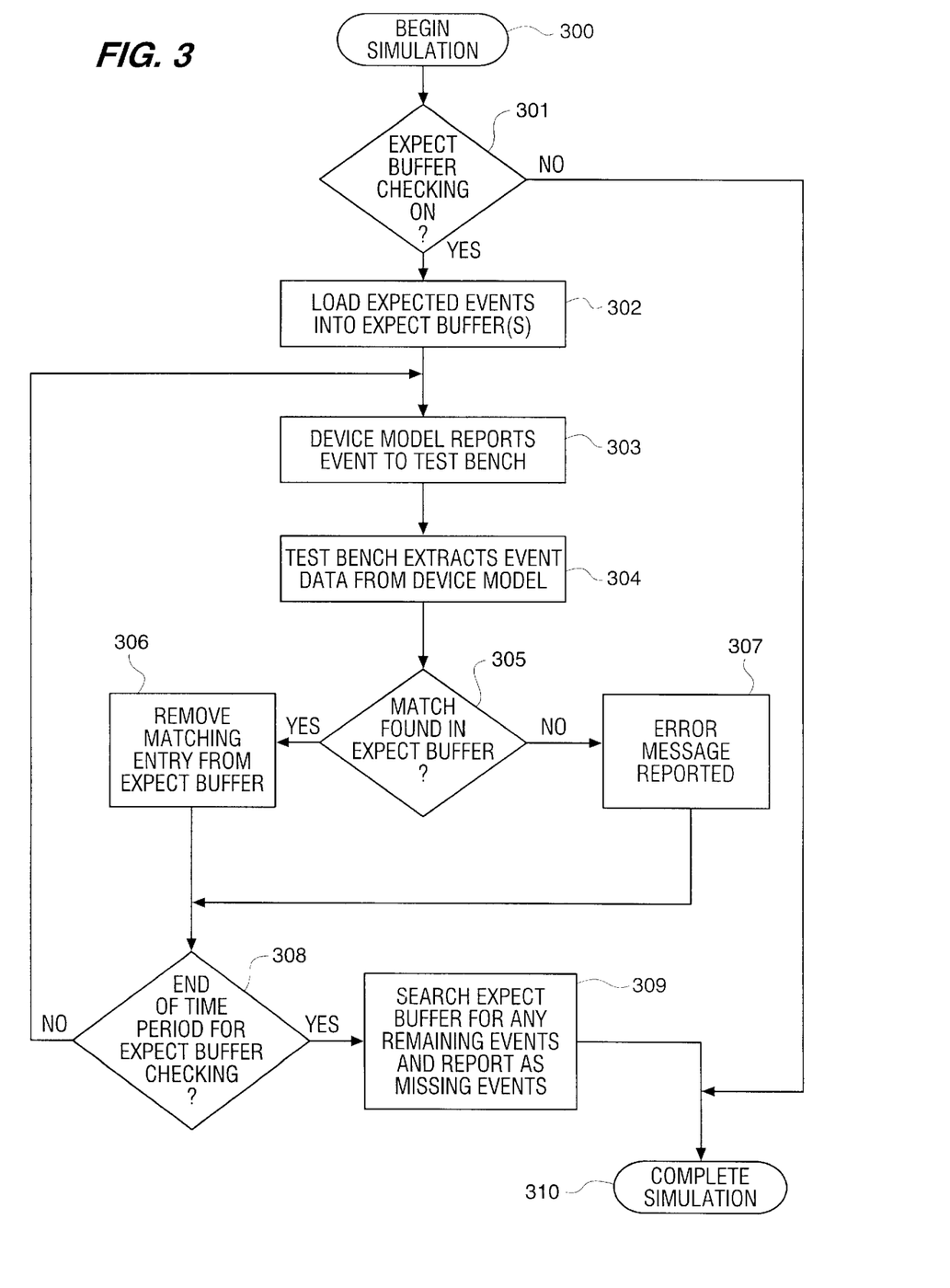
FIG. 3 is a flow chart illustrating the processing steps of the system of the present invention.

Flow Chart of Expect Buffer-Based Design Verification System Operation—FIG. 3

FIG. 3 is a flow chart illustrating the processing steps of the system of the present invention. The general operation of the expect buffer-based design verification system of the present invention is described with respect to steps 300–310.

The system of the present invention begins with step 300 during which a simulation begins. Prior to this point the DUT has been modelled as have the various devices in the DUT's environment. Also, the simulation has been defined in terms of the operations to be performed by the DUT. Once the simulation begins, processing continues to decision block 301 where it is determined if the expect buffer checking of the present invention is enabled. If yes, then processing continues to step 302 else processing continues to step 310 which is discussed below.

During step 302 the expected events for the relevant simulation are loaded into the expect buffer(s). There may be a single expect buffer or multiple expect buffers. The expect buffers may be loaded from a file containing expected events and compiled by a user. Alternatively, the expect buffers may be loaded using a function that, based on the operations defined for the simulation, generates the expected events for the simulation. Processing then continues to step 303.

Processing steps 303–308 repeat for each event occurring during the simulation time window during which expect buffer checking is enabled. During step 303, a device model experiences and records an event. The device model reports to the test bench that an event has occurred. Each time the occurrence of an event is reported to the test bench, processing continues to step 304.

During step 304 the test bench extracts the event record collected by the device model during step 303. The test bench extracts the event record collected by the device model by accessing the internal data structures of the devise model. The processing of steps 303–304 is described in more detail with respect to FIGS. 4–6. Processing then continues to decision block 305.

Decision block 305 determines whether the expect buffer contains an expected event that matches the event record extracted from the device model. If yes then processing continues to step 306 else processing continues to step 307. During step 306 the test bench operates to remove the matching entry from the expect buffer. Thus the matching entry is no longer available for searching by the test bench when subsequent event records are extracted from device models. important. During step 307 the lack of a matching entry in the expect buffer is reported as an error by the test bench. The error message of step 307 may be reported in real-time or it may be, for example, written to a file where all error messages for the simulation are accumulated. Processing continues to decision block 308 after both step 306 and step 307.

Decision block 308 operates to determine if the time window for expect buffer checking has expired or whether expect buffer checking should continue. If the time window has not expired then processing returns to step 303 to begin another pass of steps 303–308. If the time window has expired then processing continues to step 309.

During step 309 the test bench searches the expect buffer for any remaining expected events and reports them as missing event errors. During this time the system may also produce a report indicating events that occurred that were unexpected, i.e., those events flagged during step 307, and events that didn't occur that were expected, i.e., those events flagged during step 309. Processing continues to step 310 from step 309.

During step 310 the simulation is completed. The time window during which expect buffer checking occurs may represent the entire simulation time in which case processing concludes with the execution of step 310. Alternatively, the time window during which expect buffer checking occurs might represent only a portion of the total simulation time in which case step 310 represents a plurality of further steps to conclude the simulation.

Figure 4:
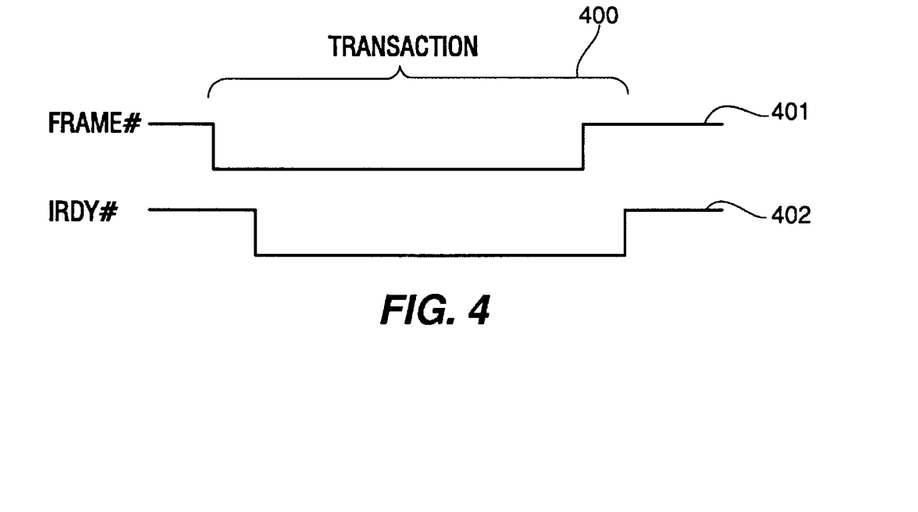
FIG. 4 depicts a time-line of a generic PCI-protocol transaction.
Figure 5:
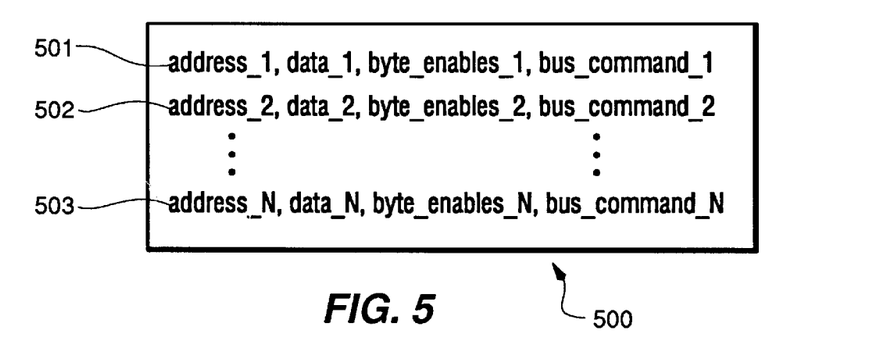
FIG. 5 depicts an exemplary event record format in a PCI implementation of the present invention.
Figure 6:
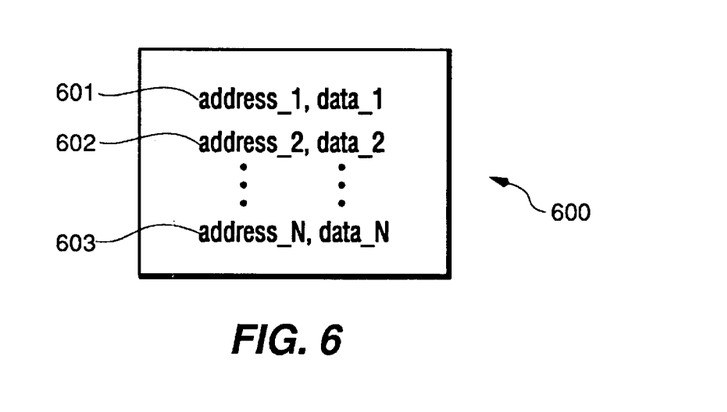
FIG. 6 depicts an exemplary event record format for a modelled RAM device.

Event Record Recording and Expect Buffer Checking—FIGS. 4–6

The generation, transfer and use of event data is further described with respect to FIGS. 4–6. As noted above, particularly with respect to processing steps 303–304 of FIG. 3, a device model reports to the test bench that an event has occurred. With each such event the test bench extracts the event record collected by the device model by accessing the internal data structures of tie device model. The format and content of the event record depends on the type of device model generating the event record. Also, the mechanism by which a device model passes information to the test bench depends on the HDL in which the system is simulated.

In the Verilog HDL language there is a data type called "event". A device model can "throw" an event and a test bench can "catch" an event. A model throws an event as a signal or notification to the test bench that there is data to extract or retrieve from the model. When an event is thrown, the test bench knows to extract the event record from the device model. As noted, this is a mechanism provided in the preferred Verilog HDL language although those skilled in the art recognize that other HDL languages provide similar mechanisms for transmitting simulation data from a modelled device to a test bench.

What comprises an event and the format and content of the event record is determined by the modelled device and the convenience of the user. For example, in a preferred embodiment, the design verification system of the present invention is applied to the simulation of a PCI to PCI bridge. The PCI to PCI bridge is the DUT and various other devices are modelled to define the environment of the DUT. Each transaction over a PCI bus is defined as an event. FIG. 4 illustrates a basic timing diagram, familiar to those skilled in the art of PCI protocol, of a PCI transaction 400. A PCI transaction begins when signal 401 (FRAME#) is asserted. A PCI transaction ends when signal 401 (FRAME#) and signal 402 (IRDY#) are both de-asserted. With reference to FIG. 2, each of device models 203–204 is configured to collect data with the start of a transaction in which the model is the target or slave device. In the PCI example, the event record is in the form illustrated in FIG. 5. Event record 500 includes rows 501–503 each of which is comprised of an address, command, byte enables and data in the form of a standard PCI message. Row 503 of event record 500 represents any number of additional rows of PCI messages. The model continues to collect event record 500 until transaction 400 is complete. When transaction 400 is complete, the model throws an event. With reference to FIG. 2, throwing an event means that one of device models 203–204 notifies test bench controller 207 over bus 206 that an event is complete. Test bench controller 207 then reads event record 500 from the model and compares event record 500 to a plurality of event records stored in expect buffer 209 looking for a matching entry, as described with respect to FIGS. 2–3. The event record stored in expect buffer 209 are of the same format as that described with respect to FIG. 5.

The user can choose to define an event with greater or lesser granularity than that described with respect to FIGS.

4-5 for the preferred embodiment. For example, with reference to FIG. 5, one could choose to throw an event record after each completed PCI message (rows 501–503) rather than after the complete PCI transaction (event 500). Alternatively, one could throw an event record after the completion of address phase address_1 and after data phase data-1 and so on. The user of the system can choose to configure models to define an event in whatever format is convenient for the user and is appropriate for the protocol between the modelled devices.

FIG. 6 illustrates an event record 600 for a RAM device which is, by comparison to data event record 500 for a PCI device, relatively simple. Communications with a RAM device require a simple combination of an address phase and a data phase. Event record 600 includes N RAM accesses 601–603. When the RAM transaction is complete, the modelled RAM device throws event record 600. In turn, the test bench catches event record 600 and compares event record 600 to entries remaining in the expect buffer. As described above with respect to FIGS. 2–3, the test bench deletes a matching entry from the expect buffer and reports the lack of a matching entry as an error.

The expected events stored in an expect buffer can be arranged and manipulated such that a certain sequence of multiple events is required in order for the corresponding expect buffer entry to be removed as a successful event. This is done where the specific ordering of events is important in verifying the proper operation of the DUT.

SUMMARY

The system of the present invention compares a present simulation, event by event, to a set of expected events stored in an expect buffer. The design verification system of the present invention allows a user to specify the events that should occur over a period of time. The system is capable of verifying that all the expected events occur and that no unexpected events occurred. The system is tolerant to design changes since the explicit timing and ordering of these events may not be important. Thus the expect buffer-based design verification system of the present invention greatly simplifies the user's process of evaluating system level simulation results.

It is to be expressly understood that the claimed invention is not to be limited to the description of the preferred embodiment but encompasses other modifications and alterations within the scope and spirit of the inventive concept.

I claim:

1. A design verification system for verifying the occurrence of an event in a simulated system wherein said system comprises a plurality of modelled devices, comprising:

means for storing expected events;

means for generating an event record wherein said event record represents the occurrence of one of a plurality of possible events at one of said modelled devices;

comparison means for determining if said event record matches one of said expected events, said comparison means including:

means for receiving said event record from one of said modelled devices;

means for matching said event record against said expected events;

means, responsive to said matching means, for determining if a matching record exists among said expected events; and means, responsive, said matching means, for determining if no matching record exists among said expected events; and reporting means responsive to said comparison means for communicating to a user the extent to which said expected events occur in said simulated system.

2. The design verification system of claim 1, wherein said means for storing expected events is a non-volatile memory device.

3. The design verification system of claim 1, wherein said means for storing expected events is a temporary buffer.

4. The design verification system of claim 1, wherein said means for generating an event record includes:

means for recognizing the start of an event and the end of an event;

means, responsive to said recognizing means, for collecting data during an event into said event record; and means for transferring said event record from one of said modelled devices to said comparison means.

5. The design verification system of claim 4, wherein said means for transferring includes:

means at one of said model devices for notifying said comparison means of the conclusion of said event; and means at said comparison means for extracting said event record from one of said model devices.

6. The design verification system of claim 1, wherein said means for determining if a matching record exists among said expected events includes means for removing said matching entry from said expected events.

7. The design verification system of claim 1, wherein said means for determining if no matching record exists among said expected events includes means for flagging an error with respect to said event record.

8. A design verification system for verifying the occurrence of an event in a simulated system wherein said system comprises a plurality of modelled devices, comprising:

means for storing expected events;

means for generating an event record wherein said event record represents the occurrence of one of a plurality of possible events at one of said modelled devices;

comparison means for determining if said event record matches one of said expected events; and reporting means responsive to said comparison means for communicating to a user the extent to which said expected events occur in said simulated system, wherein said reporting means includes:

means for reading said expected events to determine which expected events did not occur during a simulation;

means for compiling a list representing said expected events which did not occur into a human-readable report; and means for displaying said human-readable report.

9. The design verification system of claim 7, wherein said reporting means includes means, responsive to said error flagging means, for compiling a list of unexpected events which occurred during a simulation.

10. A design verification method for verifying the occurrence of an event in a simulated system, wherein said system comprises a plurality of modelled devices, comprising the steps of:

loading a set of expected events into a buffer;

receiving an event record from one of said models wherein said event record describes one of said events;

comparing said event record to said expected events to determine if a matching entry exists in said expected events;

removing, responsive to said comparing step determining the existence of said matching entry, said matching entry from said buffer; and reporting, responsive to said comparing step determining the lack of a matching entry, an unexpected event.

11. The design verification method of claim 10, wherein said receiving step includes:

identifying the start of an event at one said modelled devices;

collecting event data during said identified event into an event record; and identifying the conclusion of said identified event.

12. The design verification method of claim 11, wherein said receiving step further includes sending said event record from said modelled device to a test bench where said event record is further processed to determine whether a matching entry exists for said event record in said expected events.

13. The design verification method of claim 11, wherein said receiving step further includes:

announcing, responsive to identifying the conclusion of said identified event, the conclusion of said identified event at said one of said modelled devices; and extracting, responsive to said announcing step, said event record from said modelled device.

* * * * *

UNITED STATES PATENT AND TRADEMARK OFFICE
CERTIFICATE OF CORRECTION

PATENT NO : 5,937,182

DATED : August 10, 1999

INVENTOR(S) : Donald N. Allingham

It is certified that error appears in the above-identified patent and that said Letters Patent is hereby corrected as shown below:

Col. 8, line 53, replace "7" with --8--.

Col. 7, line 65, replace "responsive," with --responsive to--.

Col. 5, line 34, replace "devise" with --device--.

Col. 5, line 47, delete --important.--.

Col. 6, line 17, replace "tie" with --the--.

Signed and Sealed this

Sixth Day of June, 2000

*Attest:*

Q. TODD DICKINSON

*Attesting Officer*     *Director of Patents and Trademarks*